US008792591B1

(12) United States Patent
Lee (10) Patent No.: US 8,792,591 B1
(45) Date of Patent: *Jul. 29, 2014

(54) SYSTEMS AND METHODS FOR I/Q IMBALANCE CORRECTION AND CALIBRATION OF VARIABLE MODULUS SIGNALS

(75) Inventor: Chris Cheng-Chieh Lee, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 8 days.

This patent is subject to a terminal disclaimer.

(21) Appl. No.: 13/288,403

(22) Filed: Nov. 3, 2011

Related U.S. Application Data (63) Continuation of application No. 11/519,370, filed on Sep. 11, 2006, now Pat. No. 8,064,542.

(60) Provisional application No. 60/783,129, filed on Mar. 16, 2006.

(51) Int. Cl.
  *H04L 27/00* (2006.01)
(52) U.S. Cl.
  USPC ........... 375/324; 375/235; 375/320; 375/322; 327/254
(58) Field of Classification Search
  USPC ................. 375/235, 320, 322, 324; 327/254
  See application file for complete search history.

(56) References Cited

U.S. PATENT DOCUMENTS

| 5,734,577 | A | * | 3/1998 | Chesir et al. | 342/159 |
|---|---|---|---|---|---|
| 6,314,134 | B1 | * | 11/2001 | Werner et al. | 375/232 |
| 6,985,549 | B1 | * | 1/2006 | Biracree et al. | 375/355 |
| 7,031,405 | B1 | * | 4/2006 | Touzni et al. | 375/326 |
| 7,693,215 | B2 | * | 4/2010 | Chen | 375/233 |
| 2003/0035498 | A1 | * | 2/2003 | Li et al. | 375/322 |
| 2004/0052309 | A1 | * | 3/2004 | Li | 375/232 |
| 2005/0141660 | A1 | * | 6/2005 | Kim | 375/355 |
| 2005/0281327 | A1 | * | 12/2005 | Liao et al. | 375/232 |

OTHER PUBLICATIONS

Elahi, I., Muhammad, K., Balsara, P., "I/Q Mismatch Compensation Using Adaptive Decorrelation in a Low-IF Receiver in 90-nm CMOS Process", Feb. 2006, IEEE Journal of Solid-State Circuits, vol. 41 No. 2, p. 395-404.*
Elahi, Imtinan et al., "I/Q Mismatch Compensation Using Adaptive Decorrelation in a Low-IF Receiver in 90-nm CMOS Process," IEEE Journal of Solid-State Circuits, vol. 41, No. 2, Feb. 2006, pp. 395-404.

* cited by examiner

*Primary Examiner* — Shuwang Liu
*Assistant Examiner* — Sung Ahn (57) ABSTRACT

Disclosed herein are systems and methods for accurate removal of I/Q mismatch in received signals of an analog FM receiver. The analog FM receiver includes a down-converter, a calibration circuit that estimates I/Q mismatch values, and a compensation circuit that uses the estimated mismatch values to reduce the effects of I/Q mismatch. In one aspect, the calibration circuit uses an adaptive dual-parameter compensation scheme to iteratively correct the received signals by approximating a coefficient value and an amplitude value that minimize the signals' amplitude variation from the amplitude value. In another aspect, phase and amplitude mismatch parameters can be determined using the coefficient value.

22 Claims, 9 Drawing Sheets

SYSTEMS AND METHODS FOR I/Q IMBALANCE CORRECTION AND CALIBRATION OF VARIABLE MODULUS SIGNALS

This application is a continuation of U.S. patent application Ser. No. 11/519,370, filed Sep. 11, 2006 (now U.S. Pat. No. 8,064,542), which claims the benefit under 35 U.S.C. §119(e) of U.S. Provisional Application No. 60/783,129 filed Mar. 16, 2006 (now expired), both of which are hereby incorporated by reference herein in their entireties.

BACKGROUND OF THE INVENTION

In low-IF receivers, a radio-frequency (RF) signal is mixed down to intermediate frequency (IF) before data is recovered from the received signal. Low-IF receiver architecture is popular due to its inherent immunity to DC offsets and noise. An analog low-IF receiver often includes a quadrature down-converter that initially down-converts an incoming analog frequency-modulated (FM) signal to two ideally matched channels before further converting data carried by these channels into digital data.

In particular, an input analog FM signal may be represented as a combination of two sinusoids that are 90° or a quadrature phase apart from each other. This separation may be accomplished by first splitting the signal equally between two channels using, for example, a flow splitter. The resulting signals are then each mixed with signals produced by two local oscillators. The two local oscillator signals have a quadrature (90°) phase difference between them which separates the input signal into an in-phase (I) component and a quadrature-phase (Q) component, where the in-phase component is often associated with information carried by a cosine sinusoid and the quadrature component is often associated with information carried by a sine sinusoid.

This operation of mixing an input signal with the two quadrature phase oscillator signals alters the frequency content of the input signal. For example, mixing a signal m(t) with two oscillator signals $\sin(\omega_{LO}t)$ and $\cos(\omega_{LO}t)$ is mathematically equivalent to multiplying, in time domain, the signal m(t) with the complex sinusoid $e^{j\omega_{LO}t}=\cos(\omega_{LO}t)+j\sin(\omega_{LO}t)$. This will produce a resulting signal $m(t)e^{j\omega_{LO}t}$ in which its frequency content is shifted by $\omega_{LO}$ in comparison to m(t).

The mixed outputs may then be low-pass filtered to generate low-IF analog "I" and "Q" signals before being sampled and converted to digital values using analog-to-digital converters (ADC) on the respective channel paths.

The parallel nature of the two channels requires the channels to be closely matched for accurate I/Q measurements. In addition, the phase difference between the two channels must ideally be 90° at all frequencies. Often times, however, these requirements are not met due to the circuit's susceptibility to I/Q channel imbalance. One source of I/Q channel imbalance may be the flow splitter used to divide an incoming analog signal equally between the "I" and "Q" paths which may introduce phase and gain differences between the two paths. Another source of imbalance is the quadrature phase splitter used to generate the "I" and "Q"-oscillator signals which may introduce a non-orthogonal phase difference between the two signals. Furthermore, there may be differences in conversion losses between the output ports of the "I" and "Q"-channel mixers. In addition, filters and ADC's on the "I" and "Q" paths may not be perfectly matched. Theses complications will be referred to herein as "I/Q mismatch." I/Q mismatch often times degrade the performance of a communication system. While various components of a communication system may be carefully designed and manufactured, I/Q mismatch can nevertheless occur due to temperature dependencies or other environmental phenomena affecting the quality of the components.

Hence, it would be desirable to provide a method and implementation for accurate I/Q mismatch compensation and calibration in an analog FM receiver.

SUMMARY OF THE INVENTION

The invention provides systems and methods for estimating I/Q mismatch in an analog FM receiver and for mitigating the effects of I/Q mismatch in the digital representation of a received signal.

According to one aspect of the invention, the FM receiver includes a quadrature down-converter for providing a digital representation of the received analog signal. In one embodiment, the analog signal is demodulated into I and Q channels to provide the digital representation, wherein the channels contain at least one of an amplitude mismatch and a phase mismatch.

In another aspect, the FM receiver includes an I/Q mismatch compensation component for performing a computational digital process on the digital representation in order to reduce I/Q mismatch in the digital representation.

In another aspect, the I/Q mismatch compensation component includes circuitry for providing a corrected digital signal based on the digital representation. In one embodiment, the digital signal is provided by subtracting a product of a mismatch coefficient value and a complex conjugate of the digital representation from the digital representation itself.

In another aspect, the mismatch coefficient value is provided by a calibration component of the I/Q mismatch compensation component. The calibration component adjusts an estimate of the mismatch coefficient value and an estimate of an amplitude of the digital representation based on whether an amplitude of the corrected digital signal achieves a minimal deviation from the amplitude estimate.

In another aspect, a cost function is used to provide a positive definite measure of the digital signal's amplitude deviation from the amplitude estimate.

In another aspect, a gradient search algorithm may be used to iteratively adjust the estimates of the mismatch coefficient and the amplitude values in order to minimize the digital signal's amplitude deviation from the amplitude estimate as measured by the cost function.

In another aspect, the estimated mismatch coefficient value can be used to compute the phase mismatch.

In another aspect, the estimated mismatch coefficient value can be used to compute the amplitude mismatch.

Further features of the invention, its nature and various advantages, will be more apparent from the accompanying drawings and the following detailed description of the preferred embodiments.

DETAILED DESCRIPTION

A receiver system and method for reducing I/Q mismatch is disclosed. Ideal local oscillators on the "I" and "Q" paths provide periodic signals that are quadrature phase apart. For ease of explanation and without limiting the scope of the invention, it will be assumed that an ideal "I" local oscillator provides a cosine signal and an ideal "Q" local oscillator provides a sine signal.

Figure 1:
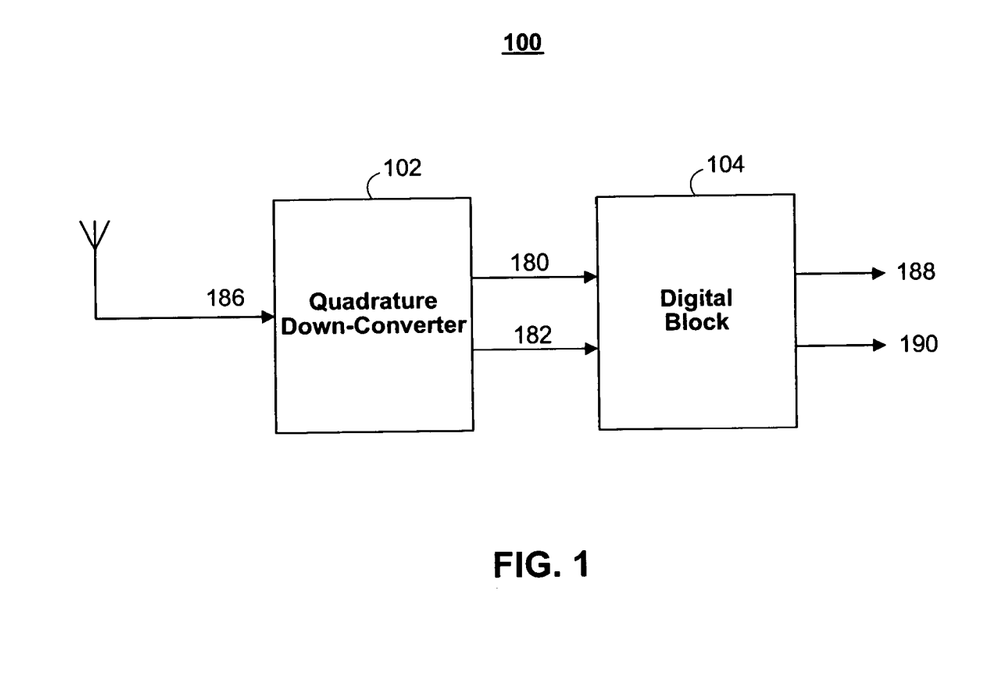
FIG. 1 is an illustrative block diagram of a receiver circuitry of the current invention that includes a down-converter block and a digital block.

FIG. 1 illustrates a simplified block diagram of an analog FM receiver 100. Receiver 100 can exist in a communication device such as, for example, a cellular telephone or a modem, for receiving information communicated from other devices.

Exemplary receiver 100 includes a quadrature down-converter 102 that demodulates an incoming analog FM signal 186 into two down-converted digital signals 180 and 182 which are then input into a digital block 104 for conversion into baseband digital data 188 and 190.

Figure 2:
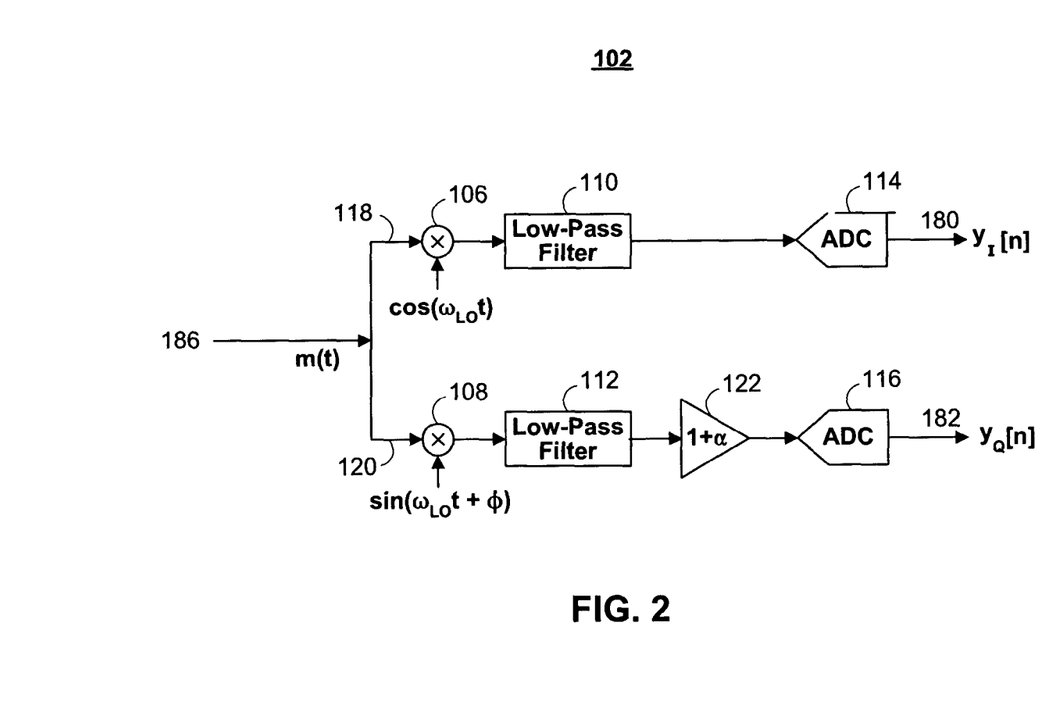
FIG. 2 is an illustrative block diagram of the down-converter circuitry from FIG. 1.

As illustrated in FIG. 2, quadrature down-converter 102 includes "I" and "Q" local mixers 106 and 108, low-pass filters 110 and 112, a gain amplifier 122, and ADC's 114 and 116. Each one of these components has the potential to introduce I/Q mismatch into the signals.

Figure 3:
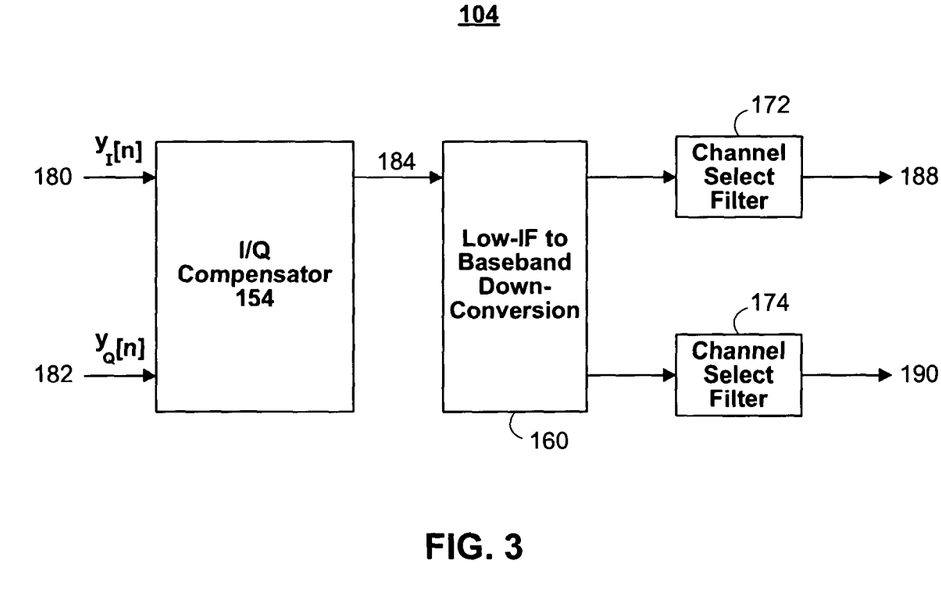
FIG. 3 is an illustrative block diagram of the digital circuitry from FIG. 1 that includes an I/Q-compensation component.

In accordance with one aspect of the invention, a receiver system may include components that mitigate the effects of I/Q mismatch. As shown in FIG. 3, digital block 104 of receiver 100 may include an I/Q mismatch compensator block 154 that processes digital signals 180 and 182 from quadrature down-converter 102 to preferably reduce the effects of any I/Q mismatch. The operation of I/Q compensator block 154 will be described below in greater detail. I/Q compensator block 154 generates a corrected digital signal 184 which may be further down-converted to baseband using a complex multiplier 160 for input into channel select filters 172 and 174, which subsequently generate digital signals 188 and 190.

As described above with respect to FIG. 2, down-converter 102 demodulates an incoming analog FM signal 186 into two down-converted digital signals 180 and 182. During the demodulation process, the various physical components of down-converter 102 may introduce I/Q mismatch to receiver system 100. It should be understood that I/Q mismatch may also occur during other stages of receiver system 100 and that I/Q mismatch may occur on either or both channels. However, to simplify the analysis of the I/Q mismatch, the I/Q mismatch may be modeled as an impaired "Q"-channel signal. In particular, I/Q mismatch between "I" channel 118 and "Q" channel 120 are characterized by two parameters: an amplitude mismatch parameter $\alpha$ and a phase mismatch parameter $\phi$. The phase mismatch $\phi$ is incorporated as a "Q"-channel mixing signal produced from a "Q"-oscillator (not shown) and the amplitude mismatch $\alpha$ is incorporated as a "Q"-channel gain amplifier 122. The altered "Q"-channel signal and the "I"-channel signal can be described mathematically by:

$$Q(t)=(1+\alpha)\sin(\omega_{LO}t+\phi) \quad \text{Equation 1}$$

and $$I(t)=\cos(\omega_{LO}t), \quad \text{Equation 2}$$

respectively, where $\omega_{LO}$ is the oscillator frequency.

With reference to FIG. 2, split input analog FM signal 118 is multiplied by an "I"-oscillator signal via local mixer 106 and passed through low-pass filter 110 and ADC 114 to produce a digital "I" component at output 180. Similarly, split input analog FM signal 120 is multiplied by a "Q"-oscillator signal and passed through low-pass filter 112 and ADC 116 to produce a digital "Q" component at output 182. In general, mixers 106 and 108, in combination with low-pass filters 110 and 112, may down-convert the input analog FM signal 186 to two analog low-IF waveforms before being sampled and converted into digital data via ADC's 114 and 116.

Under ideal conditions where "I" and "Q" channels are perfectly balanced, mismatch parameters $\alpha$ and $\phi$ both approach zero. Under these conditions, local oscillator (not shown) produces an ideal sine signal $\sin(\omega_{LO}t)$. Multiplying this sine signal with an input analog FM signal m(t) via mixer 108 would produce $m(t)\sin(\omega_{LO}t)$ as an input to low-pass filter 112. Subsequently, a digital value $m_Q[n]$ is produced at the output of ADC 116 based on using $m(t)\sin(\omega_{LO}t)$ as an input. Similarly, mixing the "I"-oscillator (not shown) signal $\cos(\omega_{LO}t)$ with m(t) generates $m(t)\cos(\omega_{LO}t)$ for input into low-pass filter 110, and applying $m(t)\cos(\omega_{LO}t)$ to the input of ADC 114 produces a corresponding digital value $m_I[n]$. It should be apparent that mixing input analog signal m(t) with the "I"- and "Q"-oscillator signals may be expressed mathematically as the product of m(t) with the complex sinusoid $e^{j\omega_{LO}t}=\cos(\omega_{LO}t)+j\sin(\omega_{LO}t)$, thus producing $m(t)e^{j\omega_{LO}t}=m(t)\cos(\omega_{LO}t)+jm(t)\sin(\omega_{LO}t)$. After the mixed waveforms are passed via ADCs 114 and 116, the resulting composite digital signal may be expressed as:

$$m[n]=m_I[n]+jm_Q[n]. \quad \text{Equation 3}$$

However, when there is I/Q mismatch in quadrature down-converter 102, and one or both amplitude and phase mismatches caused by I/Q mismatch are present, an altered "Q"-oscillator signal, as described by Equation 1 are introduced into the mathematical expressions above. In particular, the "Q"-oscillator signal from Equation 1 may be expressed as:

$$(1+\alpha)\sin(\omega_{LO}t+\phi)=(1+\alpha)\sin(\phi)+(1+\alpha)\cos(\omega_{LO}t)\sin(\phi). \quad \text{Equation 4}$$

Thus, it can be seen that I/Q mismatch causes "Q" oscillator (not shown) to produce signals that have both sine and cosine components, thereby resulting in digital values from "Q" channel 120 that are no longer orthogonal to the values from "I" channel 118.

As an illustrative example shown in FIG. 2, multiplying the impaired "Q"-oscillator signal described in Equation 4 with an input analog FM signal m(t) produces m(t) $(1+\alpha)\sin(\omega_{LO}t+\phi)$ as an input to low-pass filter 112 which subsequently generates the digital value $y_Q[n]$ at the output 182 of ADC 116. Since the "I"-oscillator signal remains unchanged, $m(t)\cos(\omega_{LO}t)$ is still applied to the input of low-pass filter 110 as in the case where I/Q mismatch is absent from the system, thus generating the digital value $y_I[n]$ at the output 180 of ADC 114. Mixing input analog FM signal m(t) with the I/Q-mismatched oscillator signals may be mathematically expressed as $m(t)\cos(\omega_{LO}t)+jm(t)(1+\alpha)\sin(\omega_{LO}t+\phi)$, or $m(t)(c_0e^{j\omega_{LO}t}+c_1e^{-j\omega_{LO}t})$, where $$c_0 = \frac{1+(1+\alpha)e^{j\phi}}{2}, \quad \text{Equation 5}$$

$$c_1 = \frac{1-(1+\alpha)e^{-j\phi}}{2}, \quad \text{Equation 6}$$

and $e^{-j\omega_{LO}t}=\cos(\omega_{LO}t)\, j\, \sin(\omega_{LO}t)$ is a complex conjugate or mirror image of $e^{j\omega_{LO}t}$. The digital values generated from the signal may be expressed as $y[n]=y_I[n]+jy_Q[n]$. Moreover, it can be recognized that $$y[n]=c_0m[n]+c_1m^*[n], \quad \text{Equation 7}$$

where $m^*[n]=m_Q[n]-jm_i[n]$ is a mirror image of the digital output m[n] from the ideal receiver system. If I/Q mismatch is absent from receiver system 100, y[n] should be equal to m[n]. However, in the presence of I/Q mismatch, signal y[n] is skewed by an additional image waveform $c_1m^*[n]$ in Equation 7. The amplitude of the desired signal m[n] in Equation 7 is also altered by a factor $c_0$.

Figure 4:
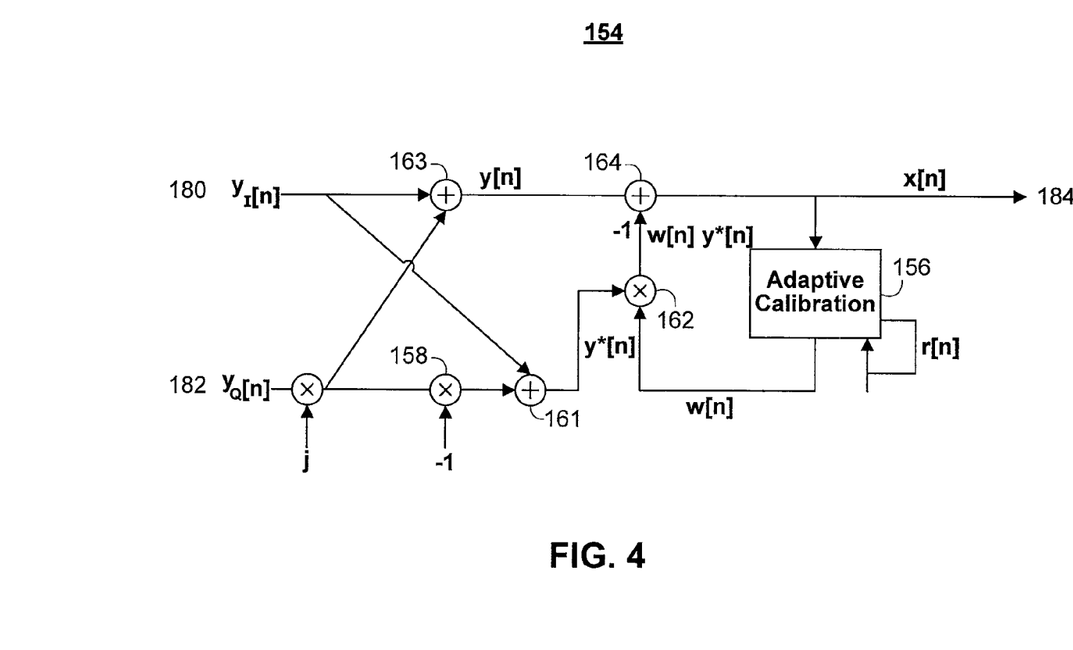
FIG. 4 is an illustrative block diagram of the I/Q-compensation circuitry from FIG. 3.

In accordance with one aspect of the invention, I/Q compensator block 154 of digital block 104 is used to estimate the I/Q mismatch values and then ideally eliminate (or at least reduce) I/Q mismatch from system 100 using the estimated I/Q mismatch values. As illustrated in FIG. 4, I/Q compensator block 154 operates by producing a compensated digital value x[n] based on the values of $y_I[n]$, $y_Q[n]$, and a complex coefficient w[n] which is determined from an adaptive calibration portion 156 of digital block 104. This complex coefficient w[n] may then be used to estimate mismatch parameters $\phi$ and $\alpha$.

In particular, FIG. 4 shows a diagram of an exemplary implementation of an I/Q compensator block 154 for mitigating I/Q mismatch in the digital output y[n]. The illustrated I/Q compensator block 154 generates the compensated signal x[n] as follows:

$$x[n]=y[n]-w[n]y^*[n], \quad \text{Equation 8}$$

where the value of coefficient w[n] is received from the adaptive calibration portion 156 of I/Q compensator block 154. In accordance with I/Q compensator block 154, the image of the input signal y[n] is generated by multiplying Q-channel data $y_Q[n]$ by −1 at multiplier 158 which is added to I-channel data $y_I[n]$ at adder 161 to yield a complex image signal $y^*[n]=y_I[n]-jy_Q[n]$. The image signal $y^*[n]$ is then multiplied by the coefficient w[n] from the adaptive calibration block 156 at multiplier 162. The resulting product is then subtract from y[n] at adder 164, where y[n] is a composite of the "Q"-channel output $y_Q[n]$ and "I"-channel output $y_I[n]$ formed at adder 163. After the subtraction at adder 164, the resulting signal x[n] is then applied to the input of adaptive calibration block 156 for iterative compensation. The iteration in I/Q compensator block 154 may stop if one or more conditions internal to adaptive calibration block 156 are satisfied.

To illustrate the mismatch-mitigating effect of I/Q compensator block 154 when a desired value of w[n] is obtained, one can use Equation 7 to expand Equation 8 as:

$$x[n]=(c_0-w[n]c_1^*)m[n]+(c_1-w[n]c_0^*)m^*[n]. \quad \text{Equation 9}$$

Hence, if an appropriate value of w[n] is chosen, such that:

$$w[n] = \frac{c_1}{c_0^*}, \quad \text{Equation 10}$$

where $c_0$ and $C_1$ are described in Equations 5 and 6, respectively, then the image term $(c_1-wc_0^*)m^*[n]$ of Equation 9 is eliminated, thus yielding:

$$x[n]=(c_0-wc_1^*)m[n]. \quad \text{Equation 11}$$

One may then multiple the signal in Equation 11 by a factor $$\frac{1}{(c_0-wc_1^*)}$$

to restore x[n] to m[n]. It can be observed that to reduce I/Q mismatch effects in the compensated signal x[n], one may manipulate the value of the complex coefficient w[n] such that x[n] would take on similar properties as the desired digital FM signal m[n] in the absence of the I/Q mismatch.

One particular property inherent in FM signals is the constant-modulus or constant-amplitude property. According to this property, a frequency-modulated waveform represents information as variations in the instantaneous frequency of a carrier wave, where the carrier wave ideally has a constant amplitude or modulus. According to another aspect of the invention, an exemplary dual-parameter adaptive calibration scheme may be provided to approximate the value of w[n] based on this constant-modulus property of a FM signal. However, in many instances, the amplitudes of the received signals are unknown or are not constant. One example of this uncertainty is presented in mobile receivers such as car radio receivers, where the intensity of received waveforms may vary from location to location. Hence, the dual-parameter calibration scheme of the invention corrects y[n] by ensuring that the compensated signal x[n] has, on average, a minimal deviation from an adaptive modulus of signals without the I/Q mismatch.

In particular, given an adaptive modulus parameter r[n], the following cost function may be used to provide a positive definite measure of the x[n] signal's modulus variation from r[n]

$$J=\tfrac{1}{4}E\{[|x[n]|^2-r^2[n]]^2\}, \quad \text{Equation 12}$$

where $E\{[|x[n]|^2-r^2[n]]^2\}$ is a calculated expected value, and x[n] is defined in Equation 8 in terms of w[n]. The dual-parameter calibration scheme operates by iteratively adjusting the estimates of the coefficient w[n] and modulus r[n] based on examining whether the output x[n] has satisfied the minimization requirement set forth by Equation 12. Namely, both w[n] and r[n] can be adaptively controlled to minimize a positive definite measure of x[n]'s modulus variation from r[n], as provided by the cost function J in Equation 12.

An iterative technique such as a gradient-search algorithm may be used to minimize the cost function J. This iterative technique has widely been employed, requires relatively few calculations and is capable of easy real-time processing. According this algorithm, information about the gradient of cost function J in Equation 12 is used as a guide to decide which direction to adjust the values of coefficient w[n] and modulus r[n] such that the cost function is minimized. At the start of the algorithm, initial values of w[n] and r[n] are selected, either arbitrarily or in a physically approximating manner. At discrete unit of time n, the value of w[n+1] (i.e., the value of w[n] for the following unit of time n+1) is approximated by updating a corrective amount to w[n]. This corrective amount is determined by a gradient of the evaluation function J, e.g., $$w[n+1] =$$
$$w[n] - \mu \nabla_w J[n] = w[n] + \mu([|x[n]|^2 - r^2[n]] \cdot x[n] \cdot y[n],$$ 
Equation 13 where step size $\mu$ is a positive real constant for controlling the corrective amount. Likewise, the value of r[n+1] at time n+1 is approximated as:

$$r[n+1] = r[n] - \mu \nabla_r J[n] = r[n] + \mu([|x[n]|^2 - r^2[n]]r[n].$$
Equation 14

At each time instance n, the output signal x[n] may be numerically determined by subtracting a compensation signal w[n] y*[n] from the corrupted signal y[n] as described in Equation 8. This dual-parameter calibration algorithm, implemented in adaptive calibration block 156 of FIG. 4, improves the accuracy with which a received analog FM signal is converted to a digital representation. It should be understood that any other suitable cost function and minimization technique may also be used in the present invention.

While the gradient search algorithm described above may be used to minimize the total effect of the I/Q mismatch on corrected output signal x[n], other suitable techniques or variations on this algorithm may also be used in accordance with the present invention. For example, instead of using a constant step size $\mu$, a variable step size $\mu$ may be used in the gradient-search algorithm, where the step size may vary with the convergence rate of the approximated solution. For example, when an approximated solution does not reach certain accuracy within a predetermined number of iterations, the step size is reduced to enhance accuracy. Otherwise, the step size is increased for faster convergence. In general, the smaller the step size is, the more accurate the solution but the slower the convergence of an iterative method.

In another exemplary variation on the gradient search algorithm, iterative updates of parameters w[n+1] and r[n+1] may not be performed at each time unit. For example, updates described according to Equations 13 and 14 may be performed at every 3 time units. In some instances, the iterative updates are initially performed at every time unit until the parameters' convergence stabilize and the updates are then only performed semi-regularly.

In another embodiment, a different approach for calculating a search direction dJ[n] that is based on the gradient of an evaluating function may be used with the gradient search algorithm. With reference to the compensation scheme described in Equations 5 and 6, instead of utilizing dJ[n]=∇J [n] as a search direction at each step n, another search direction may be used such as $$dJ[n] = \nabla J[n] + \frac{\|\nabla J[n]\|}{\|\nabla J[n-1]\|} dJ[n-1],$$

where search direction at time n is enforced to be orthogonal to the previous search directions. Orthogonality of search directions ensures that the entire solution space would be searched as the number of iterations increases.

In some embodiments, alternative minimization techniques such as a simulated annealing method may be used to minimize cost function J (Equation 12). The simulated annealing method is a probabilistic algorithm that, at each step of the algorithm, replaces the current solution by a random "nearby" solution, chosen with a probability that depends on the difference between the corresponding function values and a global parameter T. The global parameter T is gradually decreased during the simulated annealing process. The dependency is such that the current solution changes almost randomly when T is large, but converges to a global optimum as T goes to zero.

In yet one more embodiment, a Tabu search method may be used. Tabu search uses a local or neighborhood search procedure to iteratively move from a current solution to a next solution in the neighborhood of the current solution, until some stopping criterion has been satisfied. To ensure that only unexplored regions of the search space are searched at each iteration, the Tabu algorithm uses a special memory structure to keep track of the recently visited search space.

It should be understood that other suitable algorithms may also be utilized to minimize the variations of cost function J of Equation 12.

According to another aspect of the invention, I/Q mismatch parameters $\alpha$ and $\phi$ can be determined with respect to coefficient w[n]. In Equation 10, w[n] is expressed in terms of constants $C_0$ and $C_1$ given by Equations 5 and 6, respectively, in terms of $\phi$ and $\alpha$. Hence w[n] in Equation 10 may be directly expressed in terms of $\phi$ and $\alpha$, yielding $$w[n] = \frac{c_1}{c_0^*} = \frac{1 - (1+\alpha)e^{-j\phi}}{1 + (1+\alpha)e^{-j\phi}}.$$
Equation 10

Conversely, $\phi$ and $\alpha$ may be obtained with respect to w[n] according to Equation 10, where $$\alpha = \left|\frac{1-w[n]}{1+w[n]}\right| - 1,$$
Equation 11 and $$\phi = -\text{angle}\left(\frac{1-w[n]}{1+w[n]}\right).$$
Equation 12

It should be understood that other suitable schemes may be utilized to obtain mismatch parameters $\phi$ and $\alpha$.

What has been described is a system and method for estimating I/Q mismatch values in the receiver of a communication system and for reducing the effects of I/Q mismatch on a received analog FM signal using the estimated I/Q mismatch values. In one aspect, calibration of the estimated I/Q mismatch in quadrature down-converter 102 is based on the assumption that the corrected signal should have, on average, a minimal deviation from an adaptive modulus of the signal. adaptive calibration block 156 and I/Q compensator block 154 work together in a way that allows I/Q compensator block 154 to remove the I/Q mismatch from the down-converter output signals. Accordingly, adaptive calibration block 156 and I/Q compensator block 154 together implement an adaptive dual-parameter minimizing operation that iteratively adjusts the estimates of the I/Q mismatch values based on minimizing a positive definite measure of the modulus between the down-converter outputs and the compensated signals.

The illustrated embodiments of the invention are exemplary and do no limit the scope of the invention. The equations described herein as being implemented by various blocks in the disclosed communication system can be computed by hardware circuits and/or by software instructions running on a processor. The equation computations need not be performed with the exact terms and operations in the equations. For example, the equation computations can be performed using other terms and operations not shown in the equations to approximate the result of computing the equations. Thus, the various blocks in the communication system can perform computations based on the equations without directly computing the equations.

Additionally, the equations are exemplary and do not limit the scope of the invention. Although I/Q mismatch between "I" and "Q" oscillators are based on an amplitude mismatch parameter $\alpha$ and a phase mismatch parameter $\phi$, the oscillator signals may be described by equations other than Equations 1 and 2. Receiver 100 can be calibrated by using randomly-generated samples before the transmission of actual information signals. These samples can be Gaussian signals. Receiver 100 can also be calibrated using the actual transmitted signals. In addition, I/Q compensator block 154 and adaptive calibration block 156 can remove I/Q mismatch in system 100 based on properties other than the constant-modulus property. For example, calibration block 156 may operate to obtain I/Q mismatch values based on reducing cross-correlation and/or power-level differences in sequences between the corrupted input signals and the compensated output signals.

Referring now to FIGS. 5A-5E, various exemplary implementations of the present invention are shown.

Figure 5A:
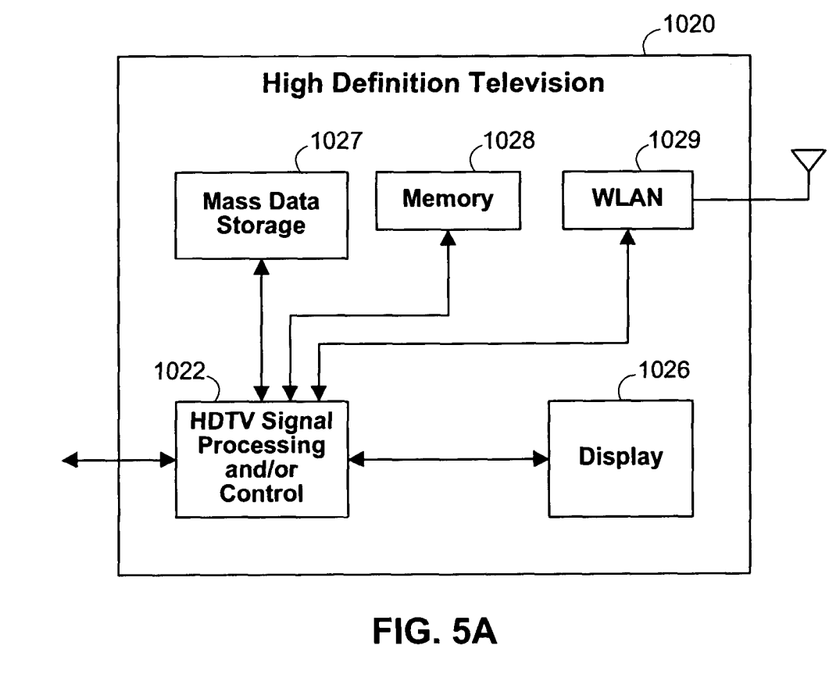
FIG. 5A is a block diagram of an exemplary high definition television that can employ the disclosed technology.

Referring now to FIG. 5A, the present invention can be implemented in a high definition television (HDTV) 1020. The present invention may implement either or both signal processing and/or control circuits, which are generally identified in FIG. 5A at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 5B:
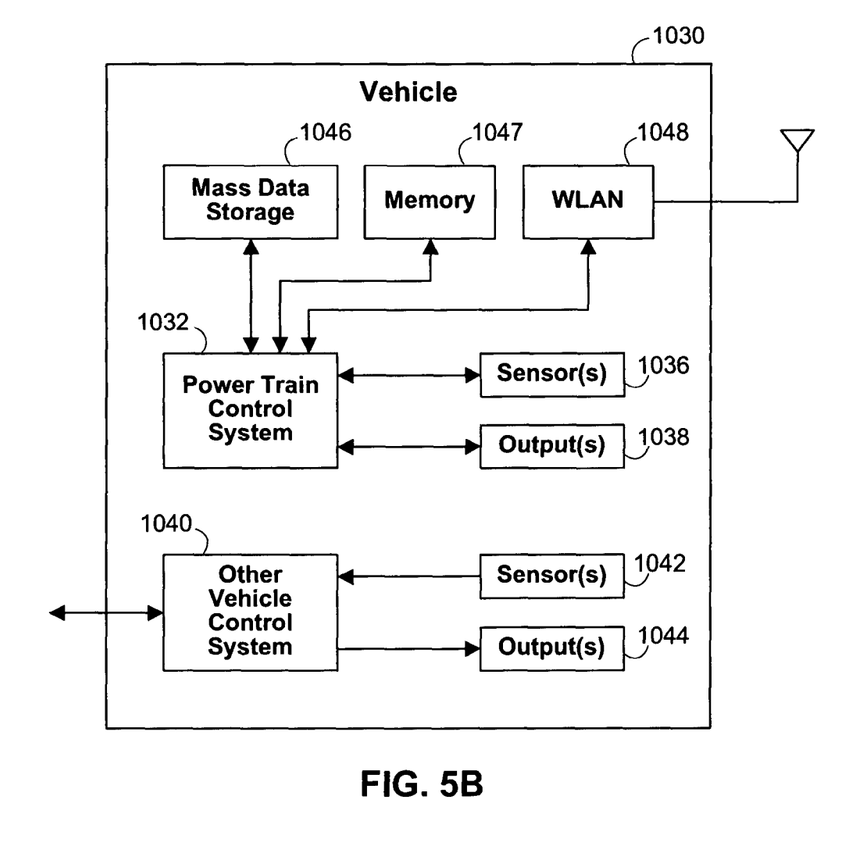
FIG. 5B is a block diagram of an exemplary vehicle that can employ the disclosed technology.

Referring now to FIG. 5B, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 5C:
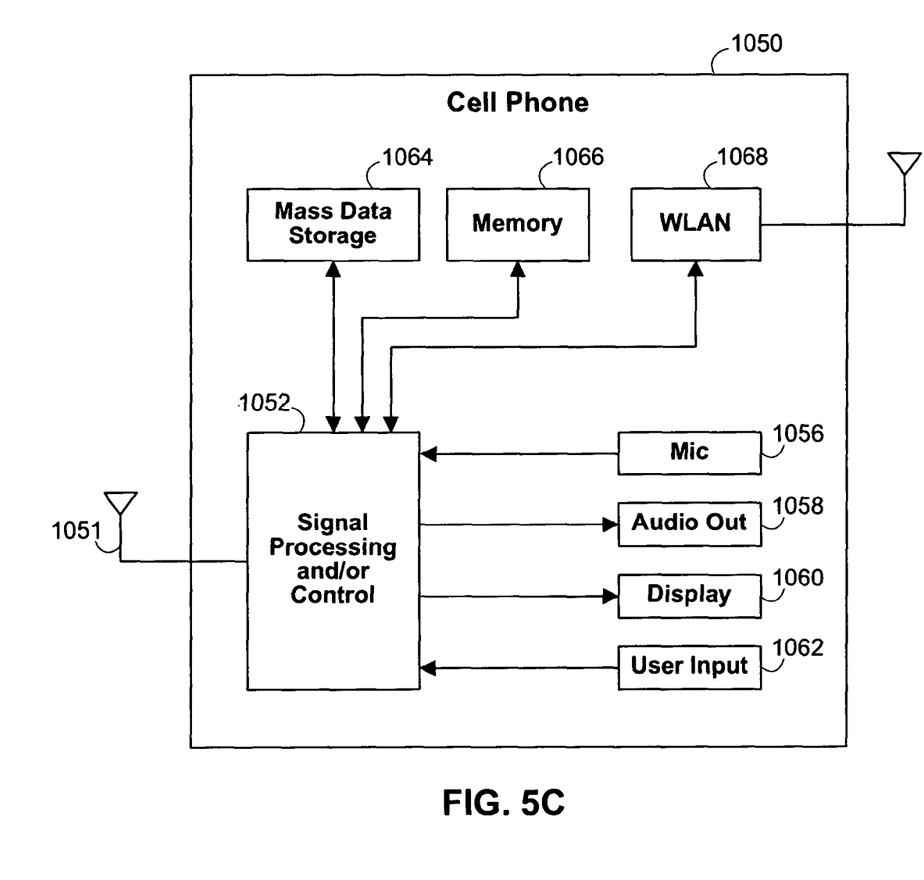
FIG. 5C is a block diagram of an exemplary cell phone that can employ the disclosed technology.

Referring now to FIG. 5C, the present invention can be implemented in a cellular phone 1050 that may include a cellular antenna 1051. The present invention may implement either or both signal processing and/or control circuits, which are generally identified in FIG. 100E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 5D:
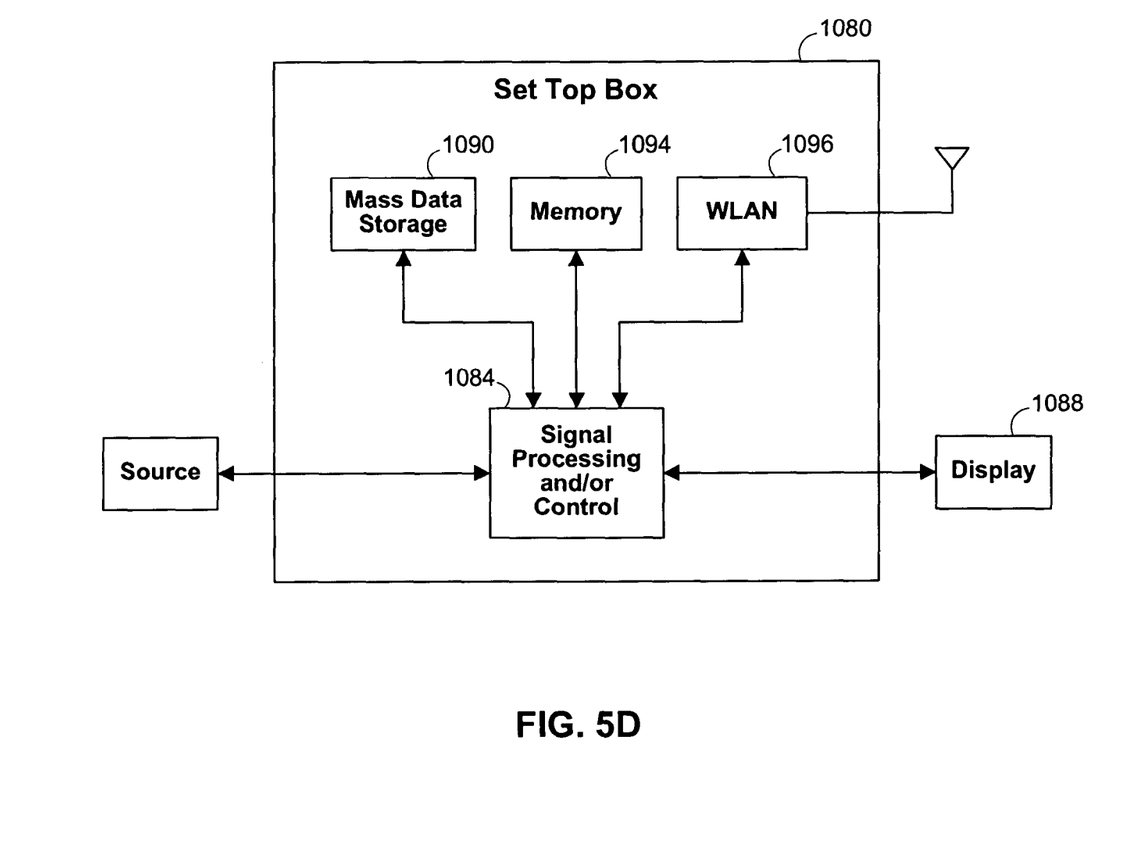
FIG. 5D is a block diagram of an exemplary set top box that can employ the disclosed technology.

Referring now to FIG. 5D, the present invention can be implemented in a set top box 1080. The present invention may implement either or both signal processing and/or control circuits, which are generally identified in FIG. 100F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 5E:
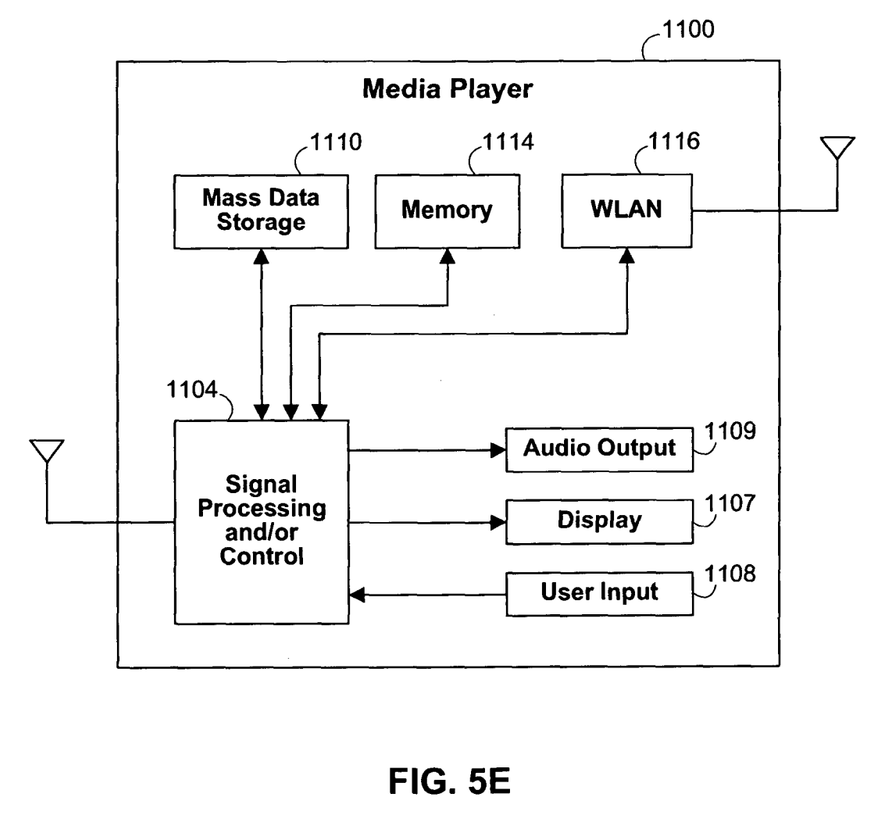
FIG. 5E is a block diagram of an exemplary media player that can employ the disclosed technology.

Referring now to FIG. 5E, the present invention can be implemented in a media player 1100. The present invention may implement either or both signal processing and/or control circuits, which are generally identified in FIG. 100G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Thus it is seen that methods for accurate I/Q-imbalance compensation and calibration in an analog FM receiver are provided. One skilled in the art will appreciate that the invention can be practiced by other than the described embodiments, which are presented for purposes of illustration and not of limitation, and the present invention is limited only by the claims which follow.

What is claimed is:

1. A method, comprising:
providing, with control circuitry, a digital signal based on a received signal and a coefficient value;
adaptively varying the coefficient value and an adaptive modulus parameter to reduce an amplitude deviation between the digital signal and the adaptive modulus parameter,
wherein the coefficient value and the adaptive modulus parameter are adaptively varied by iteratively comparing the digital signal and a previous value of the adaptive modulus parameter,
wherein a current value of the adaptive modulus parameter is updated at each iteration based on a sum of the previous value of the adaptive modulus parameter and a multiplication, and
wherein the multiplication is between the previous value of the adaptive modulus parameter and a difference expression between the previous value of the adaptive modulus parameter and the digital signal,
wherein the coefficient value is updated at each iteration based on the previous value of the adaptive modulus parameter; and
providing an estimated amplitude mismatch value and an estimated phase mismatch value based on the updated coefficient value.

2. The method of claim 1, wherein providing the digital signal comprises subtracting a product of the coefficient value and a complex conjugate of a digital representation of the received signal from the digital representation of the received signal.

3. The method of claim 1, wherein adaptively varying the coefficient value and the adaptive modulus parameter comprises using a cost function to reduce the amplitude deviation between the digital signal and the adaptive modulus parameter.

4. The method of claim 3, wherein the cost function is based on:

$$J = \frac{1}{4}E\{[|x[n]|^2 - r^2[n]]^2\},$$

wherein:
x[n] is the digital signal a time n,
r[n] is the previous value of the adaptive modulus parameter at the time n, and
$E\{[|x[n]|^2-r^2[n]]^2\}$ is an expected value.

5. The method of claim 3, wherein the amplitude deviation between the digital signal and the adaptive modulus parameter is reduced using a gradient search algorithm to update the coefficient value and the adaptive modulus parameter.

6. The method of claim 5, wherein the gradient search algorithm is based on:

$$w[n+1]=w[n]+\mu[|x[n]|^2-r^2[n]]\cdot x[n]\cdot y[n]$$

and $$r[n+1]=r[n]+\mu[|x[n]|^2-r^2[n]]r[n],$$

wherein:
x[n] is the digital signal a time n,
r[n] is the previous value of the adaptive modulus parameter at the time n,
w[n] is the coefficient value at the time n,
r[n+1] is the current value of the adaptive modulus parameter at a time n+1,
w[n+1] is the updated coefficient value at the time n+1, and
μ is a step size of the gradient search algorithm.

7. The method of claim 1, wherein the received signal is an analog signal, further comprising converting the analog signal into a digital representation by converting the analog signal into an I/Q-modulated digital signal.

8. The method of claim 1, wherein providing the estimated amplitude mismatch value comprises providing the estimated amplitude mismatch value based on:

$$\alpha = \left|\frac{1-w[n]}{1+w[n]}\right| - 1,$$

wherein:
α is the amplitude mismatch value, and
w[n] is the coefficient value at a time n.

9. The method of claim 1, wherein providing the estimated phase mismatch value comprises providing the estimated phase mismatch value based on:

$$\phi = -\text{angle}\left(\frac{1-w[n]}{1+w[n]}\right),$$

wherein:
φ is the phase mismatch value, and
w[n] is the coefficient value at a time n.

10. The method of claim 1, wherein adaptively varying the adaptive modulus parameter comprises computing the current value of the adaptive modulus parameter based on comparing the digital signal and the previous value of the adaptive modulus parameter.

11. A receiver, comprising:
circuitry configured to provide a digital signal based on a received signal and a coefficient value,
calibration circuitry configured to provide the coefficient value, wherein the calibration circuitry is configured to:
adaptively vary the coefficient value and an adaptive modulus parameter to reduce an amplitude deviation between the digital signal and the adaptive modulus parameter,
wherein the coefficient value and the adaptive modulus parameter are adaptively varied by iteratively comparing the digital signal and a previous value of the adaptive modulus parameter,
wherein a current value of the adaptive modulus parameter is updated at each iteration based on a sum of the previous value of the adaptive modulus parameter and a multiplication,
wherein the multiplication is between the previous value of the adaptive modulus parameter and a difference expression between the previous value of the adaptive modulus parameter and the digital signal,
wherein the coefficient value is updated at each iteration based on the previous value of the adaptive modulus parameter; and
provide an estimated amplitude mismatch value and an estimated phase mismatch value based on the updated coefficient value.

12. The receiver of claim 11, wherein the circuitry for providing the digital signal comprises circuitry for subtracting a product of the coefficient value and a complex conjugate of a digital representation of the received signal from the digital representation of the received signal.

13. The receiver of claim 11, wherein the calibration circuitry comprises circuitry for implementing a cost function to reduce the amplitude deviation between the digital signal and the adaptive modulus parameter.

14. The receiver of claim 13, wherein the cost function is based on:

$$J = \frac{1}{4}E\{[|x[n]|^2 - r^2[n]]^2\},$$

wherein:
x[n] is the digital signal a time n,
r[n] is the previous value of the adaptive modulus parameter at the time n, and
$E\{[|x[n]|^2-r^2[n]]^2\}$ is an expected value.

15. The receiver of claim 13, wherein the calibration circuitry comprises circuitry for implementing a gradient search algorithm to update the coefficient value and the adaptive modulus parameter for reducing the amplitude deviation between the digital signal and the adaptive modulus parameter.

16. The receiver of claim 15, wherein the circuitry for implementing the gradient search algorithm is based on:

$$w[n+1]=w[n]+\mu[|x[n]|^2-r^2[n]]\cdot x[n]\cdot y[n]$$

and $$r[n+1]=r[n]+\mu[|x[n]|^2-r^2[n]]r[n],$$

wherein:
x[n] is the digital signal a time n,
r[n] is the previous value of the adaptive modulus parameter at the time n,
w[n] is the coefficient value at the time n,
r[n+1] is the current value of the adaptive modulus parameter at a time n+1,
w[n+1] is the updated coefficient value at the time n+1, and
μ is a step size of the gradient search algorithm.

17. The receiver of claim 11, wherein:
the received signal is an analog signal, and
the circuitry configured to provide the digital signal is configured to convert the analog signal into an I/Q-modulated digital signal.

18. The receiver of claim 11, further comprising circuitry for providing an estimate of an amplitude mismatch based on:

$$\alpha = \left|\frac{1-w[n]}{1+w[n]}\right| - 1,$$

wherein:
α is the amplitude mismatch value, and
w[n] is the coefficient value at a time n.

19. The receiver of claim 11, further comprising circuitry for providing an estimate of a phase mismatch based on:

$$\phi = -\text{angle}\left(\frac{1-w[n]}{1+w[n]}\right),$$

wherein:
φ is the phase mismatch value, and
w[n] is the coefficient value at a time n.

20. The receiver of claim 11, wherein the calibration circuitry is configured to adaptively vary the adaptive modulus parameter by computing the current value of the adaptive modulus parameter based on comparing the digital signal and the previous value of the adaptive modulus parameter.

21. The method of claim 1, wherein the estimated amplitude mismatch value and the estimated phase mismatch value are based on a ratio derived from the coefficient value.

22. The receiver of claim 11, further comprising circuitry for providing an estimated amplitude mismatch value and an estimated phase mismatch value based on a ratio derived from the coefficient value.

* * * * *